(12) United States Patent
Haselhoff et al.

(10) Patent No.: US 7,418,288 B2
(45) Date of Patent: Aug. 26, 2008

(54) METHOD SOFTWARE AND APPARATUS FOR ACQUIRING MR-IMAGE DATA PERTAINING TO A MOVING ORGAN

(75) Inventors: Eltjo Hans Haselhoff, Eindhoven (NL); Rudof Theodoor Springorum, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 541 days.

(21) Appl. No.: 10/508,310

(22) PCT Filed: Mar. 18, 2003

(86) PCT No.: PCT/IB03/01069

§ 371 (c)(1), (2), (4) Date: Sep. 20, 2004

(87) PCT Pub. No.: WO03/079036

PCT Pub. Date: Sep. 25, 2003

(65) Prior Publication Data

US 2005/0165300 A1    Jul. 28, 2005

(30) Foreign Application Priority Data

Mar. 19, 2002  (EP)  ................... 02076145

(51) Int. Cl.
*A61B 5/05* (2006.01)
(52) U.S. Cl. ..................................... 600/413
(58) Field of Classification Search ................ 600/410, 600/437, 413, 419; 324/206, 309, 307; 378/4
See application file for complete search history.

(56) References Cited

U.S. PATENT DOCUMENTS

| | | | |
|---|---|---|---|
| 5,551,434 A * | 9/1996 | Iinuma | ...................... 600/455 |
| 6,057,680 A | 5/2000 | Foo et al. | |
| 6,108,573 A * | 8/2000 | Debbins et al. | ............. 600/410 |
| 6,198,959 B1 * | 3/2001 | Wang | .......................... 600/413 |
| 6,230,040 B1 * | 5/2001 | Wang et al. | .................. 600/415 |
| 6,539,074 B1 * | 3/2003 | Yavuz et al. | .................... 378/4 |
| 7,209,777 B2 * | 4/2007 | Saranathan et al. | ......... 600/410 |
| 2002/0156366 A1 * | 10/2002 | Stainsby et al. | ............. 600/413 |
| 2003/0117136 A1 * | 6/2003 | Wang et al. | .................. 324/306 |

FOREIGN PATENT DOCUMENTS

| | | |
|---|---|---|
| EP | 1 139 114 | 10/2001 |
| WO | WO 01/84172 | 11/2001 |

OTHER PUBLICATIONS

Derbyshire, J.A., et al.; Dynamic Scan-Plane Tracking; J. of Magnetic Resonance Imaging; 1998, pp. 924-932.

\* cited by examiner

*Primary Examiner*—Eric F. Winakur
*Assistant Examiner*—Lawrence N Laryea

(57) ABSTRACT

A method for acquiring MR image data pertaining an organ, moving between a first extreme and a second extreme position such as in motion due to breathing of the patient to be examined. A scout film is registered of the organ concurrently with the registration of a signal that is indicative for the position of such organ. Real-time MR image data are acquired in at least one scan-plane of said organ, and the scan-plane is adjusted depending on the concurrently measured signal estimating the position of said organ. Several scan-planes are employed. For each individual scan-plane of said plurality of scan-planes, its position as a function of time is defined in relation to pre-selected organ-positions is measured with the scout-film. During the acquisition of the real-time MR image data the respective scan-positions are each individually adjusted, each scan-plane position thereby depending on the signal indicative for the position of the organ. In particular the invention is used in cardiac MR-imaging.

7 Claims, No Drawings

METHOD SOFTWARE AND APPARATUS FOR ACQUIRING MR-IMAGE DATA PERTAINING TO A MOVING ORGAN

The invention relates to a method for acquiring MR image data pertaining to a moving organ, said organ executing motion between a first extreme and a second extreme position, said method comprising the steps of:

registering a scout film of the organ concurrently with the registration of at least one signal that is indicative for the position of such organ as measured with the scout-film acquiring real-time MR image data in at least one scan-plane of said organ, whereby the position of said scan-plane is adjusted depending on the concurrently measured signal estimating the position of said organ between its extreme positions. Such a method is known from U.S. Pat. No. 6,057,680.

In the known method the MR image data are acquired in respect of a coronary artery which is in motion between a diastolic and systolic maximum excursion positions during a cardiac cycle. The method comprises the step of tracking the location of the artery during the cardiac cycle as the artery moves between the positions of maximum excursion. In this known method the MR data are acquired at a number of locations during the cardiac cycle in a region wherein the coronary artery lies between the maximum excursion positions and wherein the excitation or acquisition scan locations are adjusted during the MR scan so as to substantially coincide with the location of the artery at the time of data acquisition. The maximum excursion position of the artery are derived from a scout film which is measured prior to the actual acquisition of real-time MR image data.

The invention aims to improve the known method and to accomplish advantages which will become apparent from the discussion below.

In a first aspect the method of the invention is characterized in that a plurality of scan-planes are employed whereby for each individual scan-plane of said plurality of scan-planes, its position as a function of time is defined in relation to pre-selected organ-positions as measured with the scout-film; and that during the acquisition of the real-time MR image data the respective scan-positions are each individually adjusted, each scan-plane position thereby depending on the signal indicative for the position of the organ. In this manner it is possible to improve the quality of the images obtained in real-time and to enhance the accuracy when these images are used in the determination of volume parameters with respect to the measured organ.

Usually, the scout-film is made in the form of a series of successive scout images represented by image signals. Preferably digital image signals are used.

Preferably the signal that is used to control the respective scan-plane positions, is responsive to a breathing cycle of a patient whose organ is being measured. The accuracy is considerably increased by the application of this measure and can be further increased when the signal alternatively or cumulatively is responsive to the autonomous motion of the organ being measured. This particularly relates to measurements of parameters relevant to the heart.

In this latter case, it is advantageous that the signal is an ECG-signal, a position signal pertaining to the lung/liver transitional plane, or both.

In a further aspect of the method according to the invention the individual scan-plane positions are defined in relation to organ-positions as identified on pre-selected images from a series of images that collectively constitute the scout-film, whereby the individual scan-plane positions relating to non-selected images that are intermediate with respect to the pre-selected images, are derived by interpolation. This measure allows for a quick patient dependent adaptation of the applied scan-planes resulting in increased accuracies in volume determination of the heart or parts thereof.

The invention is also embodied in an apparatus and in a software-program that are intended for executing the method according to the invention.

In general the advantage of the invention over the prior art is that each scan-plane of the stack of scan-planes that are employed closely follows the movements of the organ that is monitored, whereby inaccurracies that are due to movement of the organ through the concerning scan-planes is avoided.

In order to further elucidate the invention reference is made to the following non-limiting example of a specific embodiment of the method according to the invention.

EXAMPLE

In the following discussion reference is made to the heart as the organ to be measured. The invention is however applicable to other organs as well. The heart is selected merely as an example.

In the method according to the invention a preliminary prior scan, also called 'scout scan', is made of the organ to be measured, particularly the heart. To this end a motion picture constituted by a series of respective images of the heart and showing the movement of the heart, is made. The moving heart may therefore be measured for instance by application of cardiac MRI. Concurrently with the registration of the scout film at least one and preferably two of the following signals are measured that are indicative for the movement of the heart:

a so-called navigator signal measuring the movement of the transitional plane between the liver and lungs in order to monitor the breathing cycle of the patient an electrocardiogram in order to monitor the heart per se.

After registration of the scout film and the above said signals scan-plane positions are defined with respect to the heart monitored on the scout film. The respective scan-plane positions can be defined either in respect of each individual image of the scout film or preferably in respect of pre-selected images from the scout film, for instance the images relating to the both extreme positions that the heart can assume. In this latter situation use is made of interpolation to establish the scan-plane positions for intermediate positions of the heart, i.e. positions that are shown on the non-selected images from the scout film.

The aforesaid constitutes the preliminary work to be done prior to actual real-time data acquisition concerning the heart to be measured. During acquisition the position of the respective scan-planes is continuously adjusted in real-time. The amount of adjustment is derived in dependency of the concurrently measured signals relevant to either the breathing function or the movement of the heart per se or (preferably) a combination of the two. The required amount of adjustment is derived from the preliminary measurements as recorded with the scout film. In order to allow for a swift processing of the required adjustments use is made of so-called look-up tables that are known in the art. As just indicated these tables provide the parameters relevant to the positioning of the individual scan-planes as a function of the signal derived from the electrocardiogram or the navigator signal concerning the liver/lung transition or both.

The invention is not limited to the exemplary embodiment as given hereabove. This example merely serves the purpose of clarifying the appended claims which define the scope of protection of the subject invention.

The invention claimed is:

1. A method for acquiring image data pertaining to a moving heart, the method comprising:
   in a scout process concurrently:
   acquiring MR image data in stacks of scout scan planes between extreme positions of motion during a cardiac cycle and a respiratory cycle, the stack of scout scan planes including a plurality of scout scan planes,
   acquiring ECG data,
   monitoring a position of a lung/liver transition plane;
   in a registration process:
   determining a position of a selected portion of the heart in the acquired stacks of scout scan planes,
   registering a relationship between cardiac positions in each scout scan plane of the stack of scout scan planes and the ECG data and the lung/liver transition plane,
   during a real-time MR imaging process in which image data is acquired in each of a multiplicity of imaging scan planes arranged in a stack:
   acquiring the ECG data;
   monitoring the position of the lung/liver interface;
   in accordance with the determined registered relation between the ECG data and the lung/liver transition plane relative to the cardiac position in each of the scout scan planes in the stack, determining a positional offset corresponding to each of the image scan planes;
   adjusting a position of each imaging scan plane in accordance with the corresponding determined positional offset, such that the imaging scan planes in the stack are positionally adjusted differently.

2. A method of acquiring MR image data pertaining to a moving organ, which organ moves between extreme positions, the method comprising:
   registering a scout film including a series of stacks of scout scan planes with at least one signal that is indicative of a position of the organ to determine a relationship between the position indicative signal and the organ position in each of the scout scan planes of the scout film;
   concurrently monitoring the position indicative signal and acquiring a real-time MR image including a stack of image scan planes, during the real-time image acquisition adjusting a position of each imaging scan plane individually in accordance with the monitored position indicative signal and the determined relationship between the position indicative signal and the organ position in a corresponding scout scan planes of the scout film.

3. The method according to claim 2, wherein the position indicative signal is responsive to a breathing cycle of a patient whose organ is being imaged.

4. The method according to claim 2, wherein the position indicative signal is responsive to autonomous motion of the organ being imaged.

5. The method according to claim 2, wherein the organ is a heart and the position indicative signal is at least one of an ECG signal and a signal indicative of a location of a lung/liver transitional plane.

6. The method according to claim 2, wherein the organ is a heart and the position indicative signal is based on both an ECG signal and a location of a lung/liver transitional plane.

7. The method according to claim 2, wheerein adjusting the position of each image scan plane includes:
   positionally adjusting each imaging scan plane that corresponds to a scout scan plane in accordance with the determined relationship between the position indicative signal and the organ position in the corresponding scout scan planes; and
   positionally adjusting each imaging scan plane that is between a pair of scout scan planes by interpolating the determined relationship between the position indicative signal and the organ positions in the corresponding pair of scout scan planes.

* * * * *